(12) United States Patent
Yamauchi et al.

(10) Patent No.: US 6,504,229 B2
(45) Date of Patent: Jan. 7, 2003

(54) SEMICONDUCTOR DEVICE AND PROCESS OF MANUFACTURING THE SAME

(75) Inventors: Hiroshi Yamauchi, Fukuyama (JP); Masayuki Satoh, Toscana, CA (US)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/836,554

(22) Filed: Apr. 18, 2001

(65) Prior Publication Data

US 2001/0045667 A1 Nov. 29, 2001

(30) Foreign Application Priority Data

Apr. 21, 2000 (JP) .......................... 2000-121220

(51) Int. Cl.[7] .............................. H01L 29/00
(52) U.S. Cl. ................ 257/532; 257/508; 257/520; 257/524; 257/621; 257/758
(58) Field of Search ................. 257/532, 508, 257/520, 524, 621, 758–760, 774, 775

(56) References Cited

U.S. PATENT DOCUMENTS

| 5,192,988 | A | * | 3/1993 | Yoshii | 257/774 |
|---|---|---|---|---|---|
| 5,258,329 | A | * | 11/1993 | Shibata | 437/195 |
| 5,409,861 | A | * | 4/1995 | Choi | 437/195 |
| 5,874,358 | A | * | 2/1999 | Myers et al. | 438/640 |
| 6,207,566 | B1 | * | 3/2001 | Chang | 438/672 |
| 6,319,844 | B1 | * | 11/2001 | Usami et al. | 438/735 |

OTHER PUBLICATIONS

Yonekura et al.: "Effects of Charge Build–up of Underlying Layer by High Aspect Ratio Etching" Jpn. J. Appl. Phys. vol. 37 (1988) pp. 2314–2320, Part 1, No. 4B, Apr. 1998.

* cited by examiner

*Primary Examiner*—Nathan J. Flynn
*Assistant Examiner*—Remmon R. Fordé
(74) *Attorney, Agent, or Firm*—Nixon & Vanderhye P.C.

(57) ABSTRACT

A semiconductor device comprises a first insulating film, a wiring layer and a second insulating film formed in this order on a semiconductor substrate, the second insulating film being provided with one or more through holes formed onto the wiring layer, wherein the wiring layer is electrically isolated by the first insulating film and the second insulating film at a region other than a region where the through holes are formed, and a ratio between a total of a bottom area of the through holes formed onto the wiring layer and a top surface area of the wiring layer is 1:300 to 10,000.

10 Claims, 3 Drawing Sheets

SEMICONDUCTOR DEVICE AND PROCESS OF MANUFACTURING THE SAME

CROSS-REFERENCE TO RELATED APPLICATION

This application is related to Japanese application No. 2000-121220 filed on Apr. 21, 2000, whose priority is claimed under 35 USC §119, the disclosure of which is incorporated by reference in its entirety.

BACKGROUND OF THE INVENTION

1. Field of the Invention

The present invention relates to a semiconductor device and a process of manufacturing the semiconductor device. In particular, it relates to a semiconductor device provided with minuscule through holes formed by dry etching and a process of manufacturing the semiconductor device.

2. Description of Related Art

In a step of dry etching performed on an insulating film or a conductive film in the manufacture of a semiconductor device, a phenomenon called "charging" occurs, i.e., extremely high electric potential is partially applied due to charge migration within a wafer. The charging is caused by non-uniformity of plasma utilized as an etchant leading to variation of an amount of ions injected in a wafer surface.

In the current situation, the charging is remarkably problematic since a low pressure (e.g., 0.01 to 0.1 mTorr) and high density plasma source such as ECR (electron cycletron resonance), helicon, helios and the like is coming into common use for the purpose of further miniaturization.

The charging in the wafer may possibly damage a gate oxide film of transistors formed by a series of manufacturing steps, which deteriorates reliability of the semiconductor device.

Further, there is a tendency to form much thinner gate oxide film in accordance with the miniaturization of the semiconductor device, which seriously promotes the damage caused by the charging.

Therefore, various examinations have been conducted on the mechanism of how the damage is caused by the charging and on measures of alleviating the damage. Further, evaluation with respect to $Q_{BD}$, TDDB (time dependent dielectric breakdown), hot carriers and the like has been performed with various antenna patterns to examine the occurrence of the gate breakdown. From the results thereof, currently employed is a prevention of the gate breakdown by giving a limitation to the antenna ratio according to the designing rule at a stage of designing the semiconductor device.

However, the damage due to the charging has not actually been alleviated very much. Under the present circumstances, charging which does not lead to the gate breakdown and that accumulates in a floating gate are not questioned.

The charging which does not lead to the gate breakdown may possibly vary contact resistance in via holes formed by dry etching, or raise the resistance in a certain via hole.

For example, where a metal floating structure underlies the insulating layer, reaction products may remarkably be deposited or accumulated through the etching or the etching rate of the insulating layer to the underlying structure may be varied as compared to the case where the underlying structure is not floating. It is known that the etching rate of the insulating layer to the underlying structure is varied in accordance with an area of the underlying metal floating structure or an amount of charges accumulated in the metal floating structure.

Accordingly, if the charging occurs in the underlying metal structure or the like in the case where a plurality of contact holes or via holes have been simultaneously formed under the same conditions, the etching rate of the insulating film may increase depending on the kind and the size of the underlying structure. Further, reaction products are partially deposited in the holes, which leads to poor conduction at the holes and increase of the hole resistance.

To deal with such a problem, means of decreasing the etching rate of the insulating film to the underlying structure has conventionally been employed, for example, by reducing an amount of easily depositing gas ($C_4F_8$, $CH_2F_2$ and the like) or increasing an amount of diluent gas such as Ar and He to decrease a partial pressure of the easily depositing gas and reduce the deposition of reaction products.

However, the decreased etching rate causes over-etching of the underlying structure and increases loss of the underlying structure, which is problematic since a processing margin is reduced.

Under such circumstances, it has been required an alternative method of forming the via holes or the contact holes by dry etching while preventing the deposition and the accumulation of reaction products, as well as the variation of the etching rate which will cause poor conduction and high hole resistance.

SUMMARY OF THE INVENTION

The present invention has been achieved in view of the above-mentioned problem. An objective of the present invention is to provide a process of manufacturing a semiconductor device capable of forming the via holes by dry etching while preventing the deposition and the accumulation of the reaction products, the variation of the etching rate and the reduction of the processing margin, as well as the semiconductor device itself.

According to the present invention, provided is a semiconductor device comprising a first insulating film, a wiring layer and a second insulating film formed in this order on a semiconductor substrate, the second insulating film being provided with one or more through holes formed onto the wiring layer, wherein the wiring layer is electrically isolated by the first insulating film and the second insulating film at a region other than a region where the through holes are formed, and a ratio between a total of a bottom area of the through holes formed onto the wiring layer and a top surface area of the wiring layer is 1:300 to 10,000.

Still according to the present invention, provided is a process of manufacturing a semiconductor device comprising: forming a first insulating film on a semiconductor substrate; forming an electrically floating wiring layer on the first insulating film; forming a second insulating film on the wiring layer; and forming one or more through holes in the second insulating film onto the wiring layer so that a ratio between a total of a bottom area of the through holes and a top surface area of the wiring layer is 1:300 to 10,000.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1A:
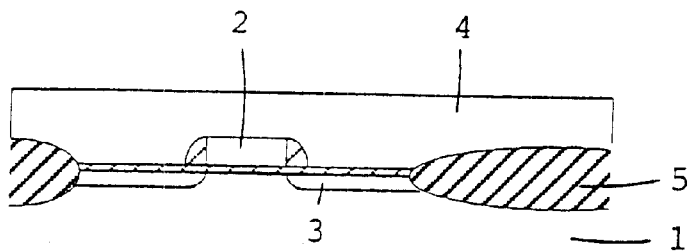
FIGS. 1(a) to 1(e) are schematic sectional views illustrating steps of a process of manufacturing the semiconductor device according to the present invention.

The present invention relates to a semiconductor device having at least a first insulating film, a wiring layer and a second insulating film in this order, preferably formed on a semiconductor substrate, and a process of manufacturing the same.

As the semiconductor substrate used in the semiconductor device of the present invention, applicable are various kinds of substrate including element semiconductor substrates such as of silicon, germanium and the like, compound semiconductor substrates such as of GaAs, InGaAs and the like, SOI substrates and multilayered SOI substrates. Among them, the silicon substrate is preferable. The semiconductor substrate may be combined with semiconductor elements such as transistors and capacitors, circuits, wiring layers, device isolation regions and insulating films formed independently or in combination thereof as desired thereon.

The first insulating film generally implies an insulating film capable of exhibiting various functions such as a gate oxide film, a tunnel oxide film, an interlayer insulating film, a capacitive insulating film and the like. Material and thickness of the insulating film are not particularly limited as long as they are generally applicable to the semiconductor device. For example, the insulating film may be a single-layered or multi-layered silicon oxide film (thermally oxidized film, LTO film, HTO film and the like), a silicon nitride film, a SOG film, a PSG film, a BSG film, a BPSG film, PZT, PLZT, a ferroelectric film or anti-ferroelectric film. The thickness may suitably be selected depending on the functions of the film, but may be about 700 to 1100 nm, for example. The first insulating film may be formed either on an almost entire surface or a partial surface of the semiconductor substrate as long as a wiring layer to be formed thereon can be in an electrically floating state as mentioned later.

The wiring layer is electrically isolated by the first insulating film and the second insulating film as mentioned later at a region other than a region where the through holes are formed as mentioned later.

The wiring layer is not particularly limited as long as it is formed of a conductive material. For example, it may be a single-layered or multi-layered of an amorphous, monocrystalline or polycrystalline N- or P-type element semiconductor (e.g., silicon, germanium and the like), or a compound semiconductor (e.g., GaAs, InP, ZnSe, CsS and the like); metals such as gold, platinum, silver, copper, aluminum and the like; refractory metals such as titanium, tantalum, tungsten and the like; silicide or polyside with a refractory metal; transparent conductive film such as ITO, $SnO_2$, ZnO and the like. The thickness of the wiring layer may be selected depending on its function, for example, about 400 to 600 nm. The configuration of the wiring layer is not particularly limited and may be in the form of rectangle, stripes, islands, lattice and the like. The wiring layer may be an upper electrode of a capacitor, a dummy electrode, a floating gate of a nonvolatile transistor and the like.

The semiconductor device of the present invention may further comprise a conductive layer such as an electrode, a wiring layer, the wiring layer is electrically isolated from the conductive layer. For example, the conductive layer may be a layer which is formed simultaneously with or previously to the wiring layer. Here, the layer formed simultaneously with the wiring layer may be a layer derived from the same layer that the wiring layer is originated from, a layer made of the same material as the wiring layer or a layer formed on the same level as the wiring layer. The layer formed previously to the wiring layer may be a layer formed in an earlier step than a step of forming the wiring layer or a layer formed under the first insulating layer or the wiring layer. However, level of both of the layers from the semiconductor substrate is less important because it varies depending on a surface configuration of the semiconductor substrate including an insulating film and the like. At least one wiring layer which is electrically isolated as mentioned above, if two or more wiring layers are provided thereon, other wiring layers may be connected with the conductive layer formed simultaneously with or previously to the wiring layer.

The second insulating film is in general an insulating film capable of serving as an interlayer insulating film. Material and thickness thereof are not particularly limited as long as they are generally applied to the semiconductor device. For example, suitable material and thickness may be selected from those listed for the first insulating film. Among them, it may preferably be a silicon oxide film, a PSG film, a BSG film or a BPSG film in a thickness of about 700 to 1100 nm. The second insulating film is formed on the almost entire surface of the semiconductor substrate including the wiring layer but may be formed on a partial surface thereof.

The second insulating film is provided with one or more through holes. It is required that at least one through hole is formed immediately above the wiring layer as mentioned above. Where a plurality of the through holes are provided, some or all of them may have different size and/or configuration, but the plural through holes provided above the same wiring layer are preferably formed in the same size and configuration. It is more preferable that all the through holes provided above the same wiring layer are the same in size and configuration. The size and the configuration of the through holes are not particularly limited, but a bottom area of each of the through holes may suitably be about 0.1 to 1.0 $\mu m^2$, 0.1 to 0.6 $\mu m^2$, 0.2 to 0.5 $\mu m^2$ or 0.3 to 0.4 $\mu m^2$. Further, the aspect ratio of each of the through holes may suitably be set to about 4 or less, about 3.4 or less, about 3.4 to 1.0, about 3.0 to 1.0 or about 3.0 to 2.5. The number of the through holes may suitably be adjusted depending on the size of the underlying wiring layer or the like, but for example, it may be about 1 to 10,000. The through holes are suitably provided so that a ratio of a total of a bottom area of the through holes with respect to a top surface area of the wiring layer becomes about 1:300 to 10,000. More preferably, the ratio may be about 1:400 to 10,000, about 1:440 to 4,000, or about 1:440 to 1,500. The configuration of each of the through holes is in the form of circle or semicircle in general, but may be in the form of rectangle or other polygons. A suitable combination of the number, bottom area and aspect ratio of the through holes, as well as the ratio of the total bottom area of the through holes with respect to the surface area of the wiring layer are selected within the above-described range and further combined with a proper etching method and/or etching conditions of the second insulating film. Accordingly, deposition and accumulation of reaction products generated during the formation of the through holes are effectively prevented, and thus conductive materials are connected through the through holes while preventing an increase and variation of contact resistance.

At the first onset of the process of manufacturing the semiconductor device of the present invention, the first insulating film is formed on the semiconductor substrate. The formation of the first insulating film may vary depending on the material used, but may be carried out by a thermal oxidation, a CVD method, a sputtering, a vapor deposition or the like. The first insulating film may be formed on an entire surface or a partial surface of the semiconductor substrate.

On the first insulating film formed is an electrically floating wiring layer. For example, the wiring layer may be provided by forming a conductive film on the entire surface of the first insulating film by a CVD method, a sputtering, a vapor deposition or the like and then patterning the conductive film into a desired configuration by a known method such as photolithography and etching. It is preferable to pattern the conductive film so that the wiring layer is provided in a region where the first insulating film only is underlying, that is, where contact holes are not formed, in order to obtain an electrically floating state of the wiring layer.

Then, the second insulating film is formed on the wiring layer in the same manner for forming the first insulating film.

Next, one or more through holes are formed in the second insulating film onto the wiring layer. The formation of the through holes is carried out by a known method such as photolithography and etching. The etching may be dry etching such as a sputtering, a reactive ion etching, a plasma etching and the like, or wet etching using acid or alkali, but the dry etching is preferable. In particular, the through holes are formed in the second insulating film by dry etching so that an etching rate between the second insulating film and the underlying wiring layer, i.e., the etching rate of the second insulating film/the wiring layer becomes greater than 1, more preferably greater than 5, 10 or 20. This etching is carried out, for example, by a plasma etching and a reactive ion etching. More specifically, plasma etching is performed by an inductively coupled plasma etching apparatus utilizing $C_2F_6$, $C_4F_8$, Ar and the like gases as etchants. Reactive ion etching is performed by a magnetic field-excited reactive ion etching apparatus utilizing $C_4F_8$, CO, Ar, $O_2$ and the like gases as etchants. The through holes need to be formed so that the ratio of a total bottom area thereof to a top surface area of the wiring layer is about 1/300 to 10,000. The bottom area and the aspect ratio of the through holes are not particularly limited but those within the above-mentioned range are suitable.

Further, according to the present invention, contact plugs may be formed in the thus formed through holes of the second insulating film by a known method, and then an upper wiring layer, upper electrode and the like may be formed on the contact plugs and the second insulating film. A multilayered wiring structure is realized by repeating a series of these steps.

Hereinafter, an example of the semiconductor device and the process of manufacturing the same according to the present invention will be described with reference to the drawings.

Experimental Example 1

Capacitors together with via holes were formed in order to determine the conditions of dry etching to be performed in the process of manufacturing the semiconductor device according to the present invention.

Figure 2A:
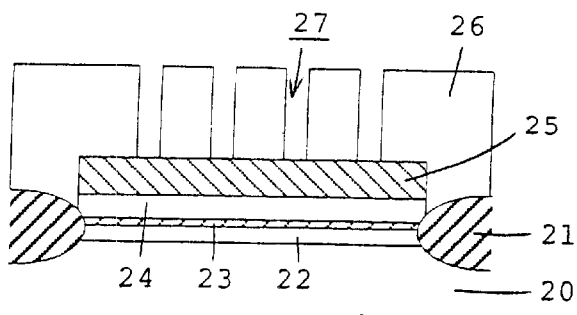
FIGS. 2(a) and 2(b) are schematic sectional views illustrating steps of manufacturing a capacitor used for capacitance measurement in order to establish the conditions of forming through holes in the process according to the present invention.

As shown in FIG. 2(*a*), a high concentration impurity region 22 was formed as a lower electrode of the capacitor by ion implantation on a silicon substrate 20 provided with device isolation regions 21. The high concentration impurity region 22 was sized into about 20 μm smaller in lengthwise and breadthwise directions than the size of an upper electrode of the capacitor described in Table 1.

On the silicon substrate 20 a silicon oxide film 23 and a silicon nitride film 24 were successively formed as an insulating film of the capacitor and a layered film 25 of TiN (1000 Å)/Ti (50 Å)/Al—Cu alloy (4000 Å)/TiN (200 Å)/Ti (300 Å) was formed as an upper electrode of the capacitor. The layered film 25 and the silicon nitride film 24 were patterned utilizing 6 different masks to have the sizes described in Table 1. Thus, capacitors each having a floating upper electrode of different size were formed.

Capacitance of each of the thus obtained capacitors was measured as an initial capacitance by C–V measurement method. The results are shown in Table 1.

Then, on each of the obtained capacitors an interlayer insulating film 26 made of a silicon oxide film of about 1.1 μm thick was formed.

In the interlayer insulating film 26, substantially cylindrical via holes 27 reaching the surface of the upper electrode are formed in the predetermined number to have a diameter of 0.36 μm at the bottom thereof by photolithography and etching utilizing an inductively coupled plasma etching apparatus or a magnetic field-excited reactive ion etching apparatus and the masks of 6 kinds shown in Table 1.

The inductively coupled plasma etching apparatus was used under the conditions of source power: 1900 W, bias power: 1400 W, etching pressure: 5 mTorr, flow rates of $C_2F_6$ gas: 10 sccm, $C_4F_8$ gas: 6 sccm and Ar gas: 95 sccm. The magnetic field-excited reactive ion etching apparatus was used under the conditions of source power: 1500 W, etching pressure: 30 mTorr, flow rates of $C_4F_8$ gas: 12 sccm, CO gas: 50 sccm, Ar gas: 2000 sccm and $O_2$ gas: 5 sccm.

TABLE 1

| Mask No. | Size of upper electrode (μm) | Initial capacitance of capacitor (pF) | Number of via holes |
| --- | --- | --- | --- |
| 1 | 220 × 220 | 167 | 1062 |
| 2 | 320 × 320 | 346 | 1274 |

TABLE 1-continued

| Mask No. | Size of upper electrode (μm) | Initial capacitance of capacitor (pF) | Number of via holes |
| --- | --- | --- | --- |
| 3 | 420 × 420 | 570 | 1274 |
| 4 | 820 × 820 | 1600 | 1698 |
| 5 | 1620 × 1620 | 3000 | 2546 |
| 6 | 3220 × 3220 | 5000 | 4242 |

The etching rate between the silicon oxide film serves as the interlayer insulating film and an underlying TiN layer was measured at the dry etching to form the via holes. Further, the ratio of a total bottom area of the via holes/an area of the upper electrode was calculated from Table 1 (see Table 2). From the results, a relationship between the etching rate of the silicon oxide interlayer insulating film/the underlying TiN layer and the ratio of the area of the total bottom area of the via holes/the upper electrode was evaluated with respect to the obtained capacitors. The results are shown in FIG. 3.

TABLE 2

| Mask No. | Area of upper electrode (μm²) | Bottom area of via holes (μm²) | Area of bottom area of via holes/upper electrode |
| --- | --- | --- | --- |
| 1 | 48400 | 108 | 448 |
| 2 | 102400 | 118 | 867 |
| 3 | 176400 | 129 | 1367 |
| 4 | 672400 | 172 | 3909 |
| 5 | 2624400 | 258 | 10172 |
| 6 | 10368400 | 431 | 24056 |

Figure 3:
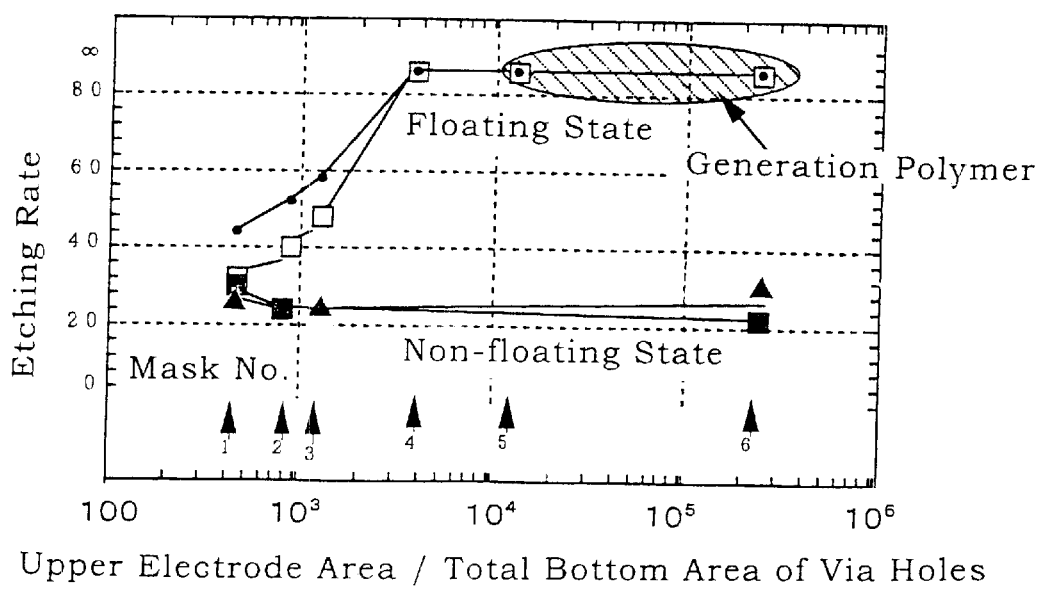
FIG. 3 is a graph illustrating a relationship between an etching rate and a ratio of an area of an upper electrode/a total bottom area of via holes in the case where the via holes are formed with various masks.

FIG. 3 shows that in both of the cases where the inductively coupled plasma etching apparatus and the magnetic field-excited reactive ion etching apparatus were used to form the via holes, the etching rate of the interlayer insulating film to the underlying TiN layer increased as the area of the lower electrode became larger, i.e., as the area occupied by the via holes per unit area of the upper electrode became smaller. In the case of the magnetic field-excited reactive ion etching apparatus (as indicated by ● in FIG. 3), the etching rate of about 42 to 80 with respect to the underlying TiN layer was obtained in the capacitors patterned with the masks of No. 1 to 4. In the case of the inductively coupled plasma etching apparatus (as indicated by □ in FIG. 3), the etching rate of about 27 to 80 with respect to the underlying TiN layer was obtained in the capacitors patterned with the masks of No. 1 to 4. In the capacitors patterned with the masks of No. 5 and 6, the etching rate of 80 or more with respect to the underlying TiN layer was obtained in both of the cases, but polymers were generated in the via holes during the etching step and reaction products were deposited on the TiN layer.

Therefore, it is found that the capacitors obtained with the masks of No. 1 to 4 were favorable in etching rate of the interlayer insulating film to the underlying TiN layer and the masks of No. 5 and 6 were inapplicable to the process of the invention.

As a Comparative Example, various capacitors and via holes were formed in the same manner as the above-described Experimental Example except that the upper electrode was connected to the silicon substrate and thus was not in a floating state. A relationship between the etching rate and the ratio of the total bottom area of the via holes/area of the upper electrode was observed. As a result, the etching rate was constant at about 22 to 25 as shown in FIG. 3 in both of the cases where the magnetic field-excited reactive ion etching apparatus was used (▲ in FIG. 3) and the inductively coupled plasma etching was used (■ in FIG. 3), regardless of the area of the upper electrode and the bottom area of the via holes.

Figure 2B:
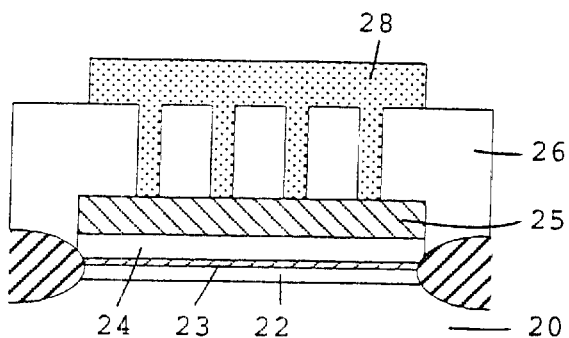

Thereafter, as shown in FIG. 2(b), an aluminum film 28 was formed on the interlayer insulating film 26 in which the via holes 27 had been formed and patterned into a desired configuration to form contact plugs and a wiring layer.

Experimental Example 2

Capacitors, via holes, contact plugs and a wiring layer were formed with the same masks and in the same manner as in Experimental Example 1 except that the via holes were formed to have a diameter of 0.32 μm (aspect ratio: about 3.4), 0.36 μm (about 3.0) and 0.40 μm (about 2.7).

Figure 4:
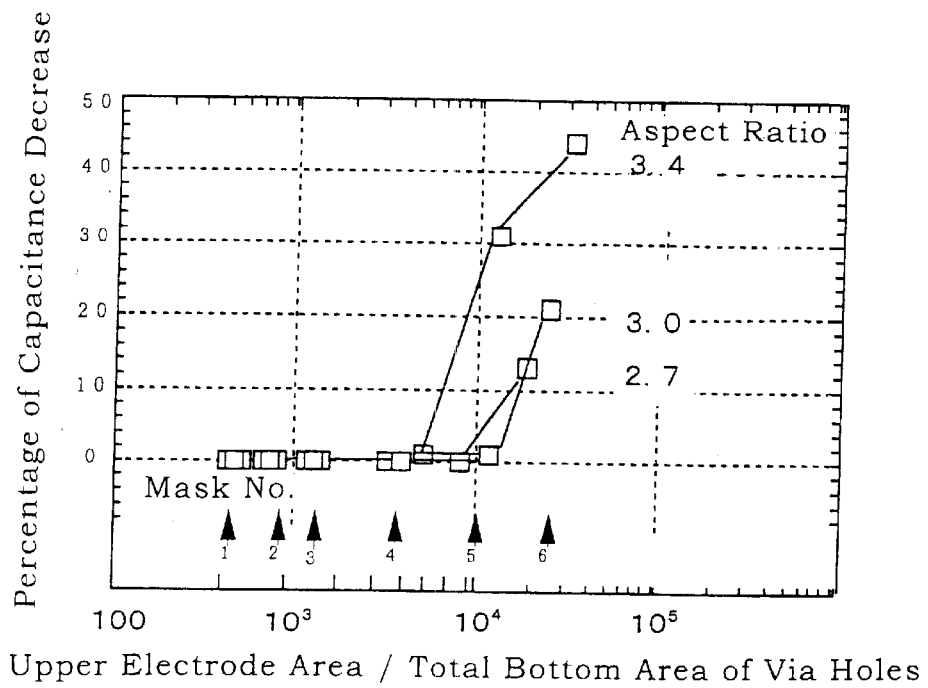
FIG. 4 is a graph illustrating a relationship between a percentage of capacitance decrease and the ratio of an area of an upper electrode/a total bottom area of via holes in the case where the via holes are formed with a magnetic field-excited reactive ion etching apparatus while varying the aspect ratio and using various masks.
Figure 5:
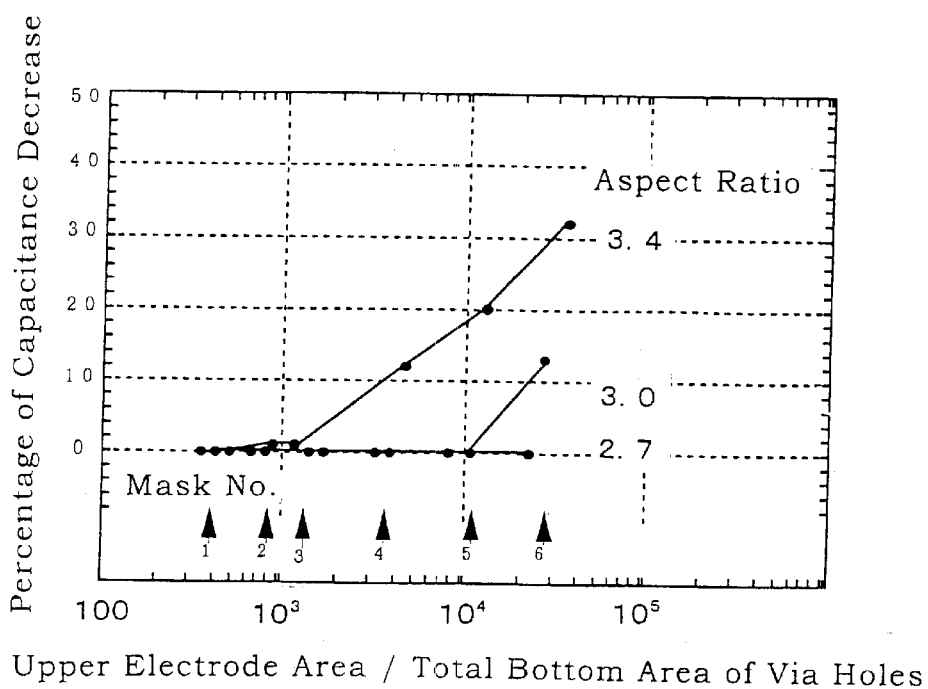
FIG. 5 is a graph illustrating a relationship between the percentage of capacitance decrease and the ratio of an area of an upper electrode/a total bottom area of via holes in the case where the via holes are formed with an inductively coupled plasma etching apparatus while varying the aspect ratio and using various masks.

Capacitance of each of the obtained capacitors was measured in the same manner as in Experimental Example 1 after the formation of the via holes, the contact plugs and the wiring layer. Then a decrease proportion thereof from the initial capacitance of each of the capacitors measured in advance before the formation of the via holes was calculated. The decrease proportion from the initial capacitance to the capacitance measured after the formation of the via holes was evaluated in percentage. FIGS. 4 and 5 show the results. FIG. 4 shows that the percentage of the decrease in the case where the via holes were formed by the magnetic field-excited reactive ion etching apparatus and FIG. 5 shows the same in the case where the via holes were formed by the inductively coupled plasma etching apparatus.

FIG. 4 indicates that no capacitance decrease was observed when the via holes having the aspect ratio of 2.7 to 3.4 were formed in the capacitors formed with the masks No. 1 to 4 by the magnetic field-excited reactive ion etching apparatus. That is, the via holes were provided without deposition and accumulation of the reaction products due to the etching.

Further, FIG. 5 indicates that when the via holes having any of the above-mentioned aspect ratio were formed by the inductively coupled plasma etching apparatus in the capacitor formed with the mask No. 1, no capacitance decrease was observed, i.e., the via holes were formed without the deposition and accumulation of the reaction products. Where the aspect ratio was 2.7 and 3.0, the decrease of the capacitance was not observed in the capacitors formed with the masks No. 1 to 5.

It was also found that the percentage of the capacitance decrease becomes greater as the aspect ratio is increased (an opening area of the via holes is decreased).

From the results, it is possible to consider as follows.

During the dry etching step, an amount of charges per unit area of the via holes increases by electron shading effect. Accordingly, charging occurs within the underlying TiN layer when etching is performed to expose the TiN layer. Then the charges are accumulated in the TiN surface, reaction products generated during the etching are adsorbed onto the TiN surface by static electricity and the reaction products are deposited and accumulated at the bottom of the via holes. The accumulated reaction products intervene between the lower electrode of the capacitor and the contact plugs, which serve as an undesirable series another capacitor. As a result, the capacitance between the lower electrode and the wiring layer decreases. Therefore, contact resistance may increase or circuits may be opened between the upper electrode and the contact plugs or the wiring layer. In particular, the capacitance remarkably decreases in a capacitor in which the area of the upper electrode is large and the area of the via holes is small, as the capacitor formed by using the mask No. 6.

From the above, it is favorable to form the via holes in the interlayer insulating film of the capacitor having any of the structures obtained with the masks No. 1 to 4 by utilizing the magnetic field-excited reactive ion etching apparatus or the inductively coupled plasma etching apparatus to have the aspect ratio of 2.7 to 3.0, since the decrease of the capacitance will not occur or is small.

FIG. 4 shows that the ratio of the area of the upper electrode/the total bottom area of the via holes in the capacitors formed with the masks No. 1 to 4 is 345 to 3015, i.e., the ratio of the total bottom area of the via holes/the area of the upper electrode is 0.0028 to 0.00033. By limiting the areas of the upper electrode and the via holes to have such a ratio, dry etching can be performed without deposition of the reaction products at the bottom of the via holes.

Where the via holes having the aspect ratio is 3.0 are formed in the capacitors formed with the masks of No. 1 to 4, the ratio of the area of the upper electrode/the total bottom area of the via holes is 448 to 3909, i.e., the ratio of the total bottom area of the via holes/the area of the upper electrode is 0.0022 to 0.00025. By limiting the areas of the upper electrode and the via holes to have such a ratio, dry etching can be performed without deposition of the reaction products at the bottom of the via holes.

Hereinafter, the process of manufacturing the semiconductor device according to the present invention will be described.

As shown in FIG. 1(a), a transistor comprising a gate electrode 2 and source/drain regions 3 is formed by a known method on a semiconductor substrate 1 provided with device isolation films 5. Then a first interlayer insulating film 4 is formed on the transistor.

Figure 1B:
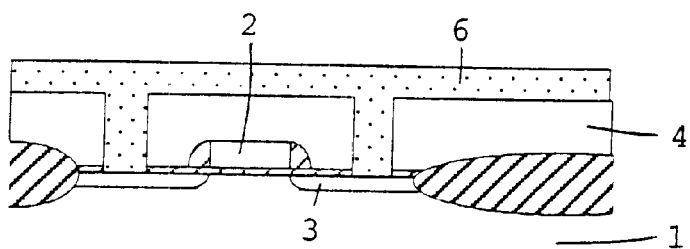

Then, contact holes are formed in the first interlayer insulating film 4 to reach the source/drain regions 3 and a first wiring film 6 of tungsten is formed thereon by sputtering or the like as shown in FIG. 1(b).

Figure 1C:
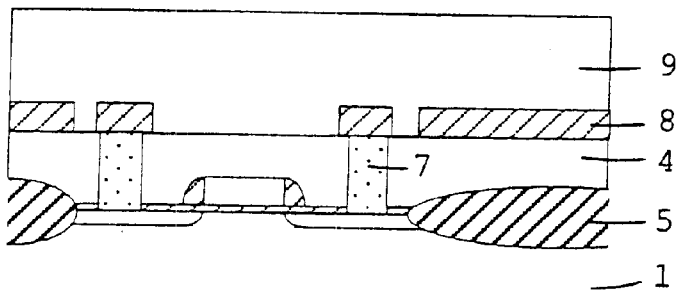

As shown in FIG. 1(c), the first wiring film 6 is etched back for planarization until the surface of the first interlayer insulating film 4 is exposed to form contact plugs 7 connecting to the source/drain regions 3. On the first interlayer insulating film 4 in which the contact plugs 7 have been buried a second wiring film 8 of aluminum is formed by sputtering or the like and patterned into a desired configuration by photolithography and etching. Among the patterned second wiring films 8, electrically floating ones are sized into 220 μm×220 μm. Then a silicon oxide film of about 1.1 μm thick is formed thereon as a second interlayer insulating film 9.

Figure 1D:
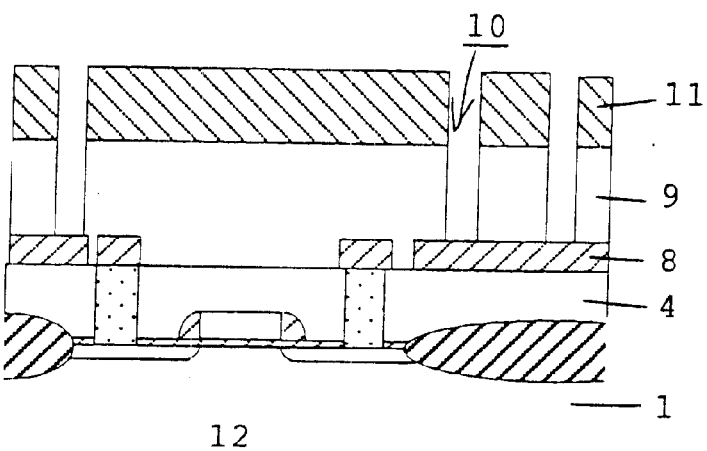

Then, as shown in FIG. 1(d), a resist pattern 11 for forming through holes 10 reaching desired positions of the second wiring film 8 is formed. With the resist pattern 11 as a mask, 1062 through holes 10 each having a diameter of about 0.36 μm are formed in the second interlayer insulating film 9. The through holes are formed by utilizing an inductively coupled plasma etcher under the conditions of source power: 1900 W, bias power: 1400 W, etching pressure: 5 mTorr and flow rates of $C_2F_6$ gas: 10 sccm, $C_4F_8$ gas: 6 sccm and Ar gas: 95 sccm.

Figure 1E:
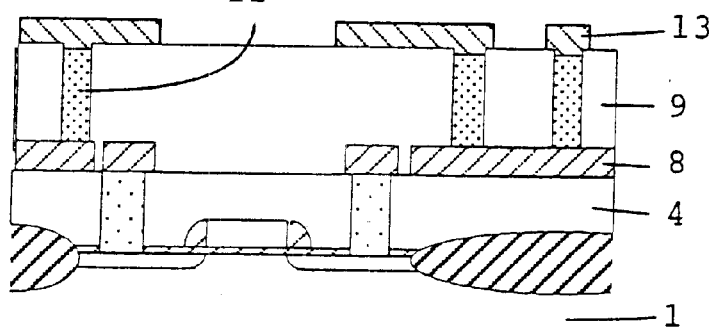

Thereafter, as shown in FIG. 1(e), a tungsten film is formed by sputtering or the like and etched back as described shape above to form contact plugs 12. On the second interlayer insulating film 9 in which the contact plugs 12 have been buried an aluminum film is formed by sputtering or the like and patterned into a desired configuration to form a third wiring layer 13.

In the thus obtained multilayered wiring structure, reaction products are not deposited or accumulated in the through holes and contact resistance between the wirings is not raised. Thus, a favorable wiring structure can be obtained.

According to the present invention, the ratio of the total bottom area of the through holes formed to reach the wiring layer and the top surface area of the wiring layer is adjusted to 1:300 to 10,000. Therefore, deposition and accumulation of the reaction products during the formation of the through holes are effectively inhibited, so that conductive materials are connected through the through holes while preventing increase and variation in contact resistance.

In particular, where each of the through holes is formed to have the aspect ratio of 4 or less and/or the bottom area of 0.1 to 1.0 $\mu m^2$, the increase and variation of the contact resistance are easily prevented.

Still according to the present invention, a semiconductor device capable of preventing the increase and variation of the contact resistance is easily manufactured by forming a first insulating film on a semiconductor substrate; forming an electrically floating wiring layer on the first insulating film so that it is not connected to a conductive layer formed simultaneously with or previously to the wiring layer; forming a second insulating film on the wiring layer; and forming one or more through holes in the second insulating film onto the wiring layer so that a ratio between a total of a bottom area of the through holes and a top surface area of the wiring layer is 1:300 to 10,000.

Where the through holes are formed in the second insulating film by dry etching at the etching rate of the wiring layer to the second insulating film greater than 1, in particular where the dry etching is carried by an inductively coupled plasma etching method utilizing $C_2F_6$, $C_4F_8$ and Ar gases as etchants or a magnetic field-excited reactive ion etching method utilizing $C_4F_8$, CO, Ar and $O_2$ gases as etchants, an amount of charges accumulated in the underlying wiring layer is controlled at the etching to form the through holes so that the deposition and accumulation of the reaction products in the through holes are easily controlled. Further, increase of the contact resistance at the through holes is prevented to improve device properties. Thus, a highly reliable semiconductor device can surely be obtained.

What is claimed is:

1. A semiconductor device comprising:
   a first insulating film, a wiring layer and a second insulating film formed in this order on a semiconductor substrate, the second insulating film being provided with one or more through holes formed onto the wiring layer,
   wherein the wiring layer is electrically isolated by the first insulating film and the second insulating film at a region other than a region where the through holes are formed, and
   a ratio between a total of a bottom area of the through holes formed over the wiring layer and a top surface area of the wiring layer is from 1:300 to 1:10,000 (or from 0.00333 to 0.0001).

2. A semiconductor device according to claim 1, wherein an aspect ratio of the through hole is 4 or less.

3. A semiconductor device according to claim 1, wherein the bottom area of each of the through holes is 0.1 to 1.0 $\mu m^2$.

4. A semiconductor device according to claim 1, wherein the wiring layer is an upper electrode of a capacitor, a dummy electrode or a floating gate of a nonvolatile transistor.

5. A semiconductor device according to claim 1, wherein a contact plug is formed in the through hole of the second insulating film so as to connect the wiring layer, and an upper wiring layer or an upper electrode is formed on the contact plug and the second insulating film so as to connect the contact plug.

6. A semiconductor device according to claim 1, further comprising a conductive layer formed simultaneously with the wiring layer, wherein the wiring layer is electrically isolated from the conductive layer.

7. A semiconductor device according to claim 1, further comprising a conductive layer formed previously to the wiring layer, wherein the wiring layer is electrically isolated from the conductive layer.

8. The semiconductor device of claim 1, wherein the ratio between the total of the bottom area of the through holes and the top surface area of the wiring layer is from about 1:400 to 1:10,000 (or from about 0.0025 to 0.0001).

9. The semiconductor device of claim 8, wherein the ratio is from about 1:440 to 1:4,000 (or from about 0.00227 to 0.00025).

10. The semiconductor device of claim 9, wherein the ratio is from about 1:400 to 1:1,500 (or from about 0.00227 to 0.000667).

* * * * *